(12) United States Patent
Takeuchi et al.

(10) Patent No.: US 8,073,166 B2
(45) Date of Patent: *Dec. 6, 2011

(54) ELECTRETIZATION METHOD AND APPARATUS

(75) Inventors: Yusuke Takeuchi, Kanagawa (JP); Hiroshi Ogura, Tokyo (JP)

(73) Assignee: Panasonic Corporation, Osaka (JP)

( * ) Notice: Subject to any disclaimer, the term of this patent is extended or adjusted under 35 U.S.C. 154(b) by 1338 days.

This patent is subject to a terminal disclaimer.

(21) Appl. No.: 11/702,530

(22) Filed: Feb. 6, 2007

(65) Prior Publication Data

US 2007/0274544 A1    Nov. 29, 2007

(30) Foreign Application Priority Data

Mar. 28, 2006  (JP) .................................. 2006-088099

(51) Int. Cl.
*H04R 25/00* (2006.01)
(52) U.S. Cl. ......................... 381/174; 381/369; 381/175
(58) Field of Classification Search .................. 381/369, 381/173–176, 190–191, 361, 365, 423–424, 381/431
See application file for complete search history.

(56) References Cited

U.S. PATENT DOCUMENTS 6,731,766 B2 *   5/2004   Yasuno et al. ................. 381/171

FOREIGN PATENT DOCUMENTS

| JP | 56-58220 | 5/1981 |
|---|---|---|
| JP | 11-088992 | 3/1999 |
| JP | 2000-508860 | 7/2000 |
| JP | 2002-218594 | 8/2002 |
| JP | 2003-047095 | 2/2003 |
| JP | 2003-282360 | 10/2003 |
| JP | 2005-020411 | 1/2005 |
| WO | WO 97/39464 | 10/1997 |

OTHER PUBLICATIONS

PCT/JP2006/311248, not yet published, Matsushita Electric Ind Co LTD.

* cited by examiner

*Primary Examiner* — Suhan Ni
(74) *Attorney, Agent, or Firm* — McDermott Will & Emery LLP

(57) ABSTRACT

While a dielectric film is set to have a ground potential, a fixed electrode is set to have a different potential from the ground potential. Thereafter, ions produced by corona discharge are allowed to pass through a plurality of acoustic holes formed in the fixed electrode and reach the dielectric film, thereby electretizing the dielectric film.

10 Claims, 4 Drawing Sheets

ELECTRETIZATION METHOD AND APPARATUS

BACKGROUND OF THE INVENTION (1) Field of the Invention

The present invention relates to electretization methods and apparatuses for dielectric films of condenser microphones formed using a micromachining technique for silicon.

(2) Description of Related Art

Electret condenser microphones (ECMs) are small acousto-electric transducers in which the need for a direct-current bias of a condenser is eliminated by detecting, as an electrical signal, a variation in the capacity of the condenser arising from an acoustic wave and utilizing an electret film possessing a semipermanent electric polarity.

An electret film (at least partially polarized dielectric film) of an ECM is made of, for example, an organic dielectric film, such as fluoroethylene propylene (FEP), and formed by injecting electric charges into this dielectric film and fixing the injected electric charges in the dielectric film. A potential difference is produced between both electrodes of a condenser, between which the dielectric film is interposed, by an electric field formed of the electric charges injected into the dielectric film. The process of injecting electric charges into a dielectric film and fixing the injected electric charges in the dielectric film is called "electretization".

A dielectric film (electret film) is formed of a thin film made of FEP or any other material, and a metal, such as gold and nickel, is deposited on the outer surface of the thin film by evaporation or any other method.

Known methods for injecting charges into a dielectric film to form an electret film includes methods illustrated in FIGS. 6 and 7 (see, for example, Japanese Patent Laid-Open Publication No. 56-58220).

FIG. 6 is a cross-sectional view illustrating a principal part of a known apparatus for electretizing a dielectric film by causing corona discharge using a needle electrode.

In the apparatus illustrated in FIG. 6, a FEP thin film 4 is placed on a ground electrode (metal tray) 5, direct current corona discharge is caused by a needle electrode 6 connected to a high voltage power source 7, and resultant ions are injected into the FEP thin film 4 to fix the injected ions in the FEP thin film 4, thereby electretizing the FEP thin film 4.

FIG. 7 is a cross-sectional view illustrating a principal part of a known apparatus for electretizing a dielectric film by causing corona discharge using a wire electrode. In FIG. 7, the same components as those in FIG. 6 are denoted by the same reference numerals.

In the apparatus illustrated in FIG. 7, a FEP thin film 4 is placed on a ground electrode (metal tray) 5, direct current corona discharge is caused by a wire electrode 21 connected to a high voltage power source 7, and resultant ions are injected into the FEP thin film 4 to fix the injected ions in the FEP thin film 4, thereby electretizing the FEP thin film 4. Since in the apparatus illustrated in FIG. 7 the wire electrode 21 extends two-dimensionally, it has an advantage that ions can be extensively applied to the FEP thin film 4.

In view of the above, ECMs are generally fabricated in consideration of mass productivity in the following manner. A plurality of FEP thin films (dielectric films) are arranged on a metallic tray, and corona discharge is caused by the apparatus in FIG. 7, thereby electretizing a large number of FEP thin films at once. Since this method, however, may prevent ions from being uniformly applied to the FEP thin films, the FEP thin films may have different amounts of electret charges according to their locations on the tray. As a result, microphones have different sensitivities. Furthermore, in some cases, microphones have different sensitivities not only due to differences in the amount of electret charges among FEP thin films but also due to differences in parasitic capacitance and the capacities of field effect transistors (FETs) among microphones and other factors.

In the above-mentioned known example, a dielectric film itself to be electretized is taken out and then electretized. Such a known art can be said to be an art based on an ECM constructed by assembling mechanical parts.

On the other hand, in recent years, a technique has been suggested in which an ultrasmall condenser microphone is formed by micromachining a silicon substrate without assembling mechanical parts (see, for example, Japanese Patent Laid-Open Publication No. 11-88992, Japanese Patent Laid-Open Publication No. 2005-20411 and Published Japanese translation of a PCT application No. 2000-508860).

A condenser microphone of silicon fabricated by a technique for fabricating a so-called micro-electro-mechanical system (MEMS) element is referred to as a "silicon microphone (or silicon mic)". A method for fabricating a silicon microphone using the technique for fabricating a MEMS element has received attention as a technique for fabricating an ECM for being incorporated into a cell phone terminal or the like whose reduction in size and thickness has been progressing (see, for example, Japanese Patent Laid-Open Publication No. 11-88992).

Since the silicon microphone is fabricated by processing a silicon substrate using a semiconductor process technique, this prevents a fabrication process for a silicon microphone from being able to include electretization that is not associated with a semiconductor process. In other words, it is impossible that a dielectric film alone is taken out and separately electretized.

In view of the above, a silicon microphone disclosed in, for example, Japanese Patent Laid-Open Publication No. 2005-20411 is a condenser microphone without an electret film.

However, it is not impossible that dielectric films of silicon microphones are electretized. For example, in a silicon microphone disclosed in Published Japanese translation of a PCT application No. 2000-508860, a dielectric film can be electretized.

More particularly, the silicon microphone disclosed in Published Japanese translation of a PCT application No. 2000-508860 includes a first silicon substrate (microphone film) including a dielectric film formed on the first silicon substrate and a second silicon substrate (microphone back plate) bonded to the first silicon substrate. The dielectric film is electretized in the last process step of a fabrication process for the first silicon substrate, and thereafter the first silicon substrate is bonded to the second silicon substrate.

According to a silicon microphone and a method for fabricating the same which are disclosed in International Patent Application No. PCT/JP2006/311248, in a silicon microphone formed of a single silicon substrate and having an unexposed dielectric film, the dielectric film can be electretized.

More particularly, an electretization method for the silicon microphone disclosed in International Patent Application No. PCT/JP2006/311248 is a method for electretizing dielectric films that are components of condenser microphones after mounting, on a substrate for packaging, chips for condenser microphone use which are formed by micromachining a silicon substrate. Each of condenser microphones is separately subjected to at least one corona discharge using a single needle electrode, thereby electretizing an associated dielectric film.

According to an electretization method disclosed in Japanese Patent Laid-Open Publication No. 2003-282360, when corona discharge is to be caused, a grid electrode is placed between an electrode used for corona discharge and an object to be electretized, thereby electretizing the object while controlling the motion of ions. In this way, the amount of electret charges can be controlled.

SUMMARY OF THE INVENTION

As described above, when a silicon microphone is to be fabricated by micromachining a silicon substrate using a semiconductor fabrication process, a dielectric film alone cannot be essentially taken out and electretized. Therefore, it is difficult to fabricate an electret condenser microphone (ECM).

As in the art disclosed in, for example, Published Japanese translation of a PCT application No. 2000-508860, a fabrication method for a silicon microphone in which respective processes for fabricating two substrates are carried out and both the substrates are finally bonded to each other allows a dielectric film to be electretized. However, a fabrication process for a silicon microphone becomes complicated.

When the silicon substrate is micromachined, devices are likely to have different sizes, and variations in the performance of electronic components, such as FETs, mounted on a substrate for packaging may be unignorable. Accordingly, silicon microphones have different sensitivities. Published Japanese translation of a PCT application No. 2000-508860, however, does not disclose any measure for coping with such variations in the sensitivities of silicon microphones.

In a method for separately subjecting each of condenser microphones to at least one corona discharge using a single needle electrode as in the art disclosed in International Patent Application No. PCT/JP2006/311248, in order to electretize a dielectric film such that an intended amount of charges are deposited on the dielectric film, various conditions to be adjusted (e.g., an electrodeposition distance (the distance between an electrode for corona discharge and a dielectric film) and a voltage that should be applied to the electrode to cause corona discharge) on which corona discharge is caused must be previously tested. Then, the relationship between the various conditions to be adjusted and the amount of deposited charges must be examined to determine the electretization conditions under which the intended amount of charges are deposited on the dielectric film.

Furthermore, in the method of International Patent Application No. PCT/JP2006/311248, ions produced by corona discharge are allowed to pass through acoustic holes formed in a fixed electrode and reach the dielectric film, thereby electretizing the dielectric film. Therefore, when the acoustic holes in the fixed electrode become small, this prevents ions produced by corona discharge from being able to reach the dielectric film not only in the case of use of a wire electrode but also in the case of use of a needle electrode.

The present invention is made based on the above-described consideration and its object is to allow a dielectric film of a condenser microphone formed by micromachining a silicon substrate to be electretized with high accuracy such that even when acoustic holes in a fixed electrode are small, an intended amount of charges are deposited on the dielectric film without previously examining the electretization conditions.

In order to achieve the above-described object, the present invention is configured such that in a condenser microphone, corona discharge is caused above a fixed electrode while a dielectric film is set to have a ground potential and the fixed electrode is set to have a different potential from the ground potential, thereby electretizing the dielectric film.

According to the present invention, corona discharge is caused above a fixed electrode of a chip for a condenser microphone with the potential of the fixed electrode set at a different potential from a ground potential. In this way, ions produced by corona discharge are allowed to pass through acoustic holes in the fixed electrode and reach a dielectric film while being controlled by the potential of the fixed electrode. In this manner, the dielectric film can be electretized. The dielectric film is further electretized until the potential of the dielectric film on which charges have been deposited becomes equal to the potential of the fixed electrode. The dielectric film can be electretized with high accuracy such that an intended amount of charges are deposited on the dielectric film without previously examining the relationship between the electretization conditions and a voltage at which the dielectric film is electretized (the potential of the dielectric film on which charges have been deposited).

As described above, the present invention provides the effect that in a silicon microphone (silicon mic) using a semiconductor chip formed by micromachining a silicon substrate, a dielectric film can be electretized with high accuracy such that a target potential is achieved by electretization, and is useful as an ultrasmall silicon microphone incorporated into a mobile communication device, an electretization method for the silicon microphone, and an electretization apparatus used for fabrication of the silicon microphone.

DETAILED DESCRIPTION OF THE INVENTION

In first through third embodiments of the present invention, as described below, corona discharge is caused above a fixed electrode of a condenser microphone with the fixed electrode set at a different potential from a ground potential. In this way, ions produced by corona discharge are allowed to pass through acoustic holes in the fixed electrode and reach a dielectric film while being controlled by the potential of the fixed electrode, thereby electretizing the dielectric film. The dielectric film is electretized until the potential of the dielectric film on which charges have been deposited becomes equal to the potential of the fixed electrode. The dielectric film can be electretized with high accuracy such that an intended amount of charges are deposited on the dielectric film without previously examining the relationship between the electretization conditions and a voltage at which the dielectric film is electretized (the potential of the dielectric film on which charges have been deposited).

In the second embodiment of the present invention, as described below, when charges are deposited on a dielectric film before a chip for a microphone is mounted on a substrate for packaging, this eliminates the need for electrically connecting a chip for a microphone to a substrate for packaging through a bonding wire or the like in order to deposit charges on the dielectric film.

Furthermore, since in the second embodiment of the present invention charges are deposited on the dielectric film before the chip for a microphone is mounted on the substrate for packaging as described below, the following effect can be provided. More particularly, a condenser microphone that is not packaged is examined in terms of its sensitivity and the amount of electret charges. This examination allows defective chips to be detected before packaging. This reduces the loss caused by discarding substrates for packaging and packaged devices.

In the third embodiment of the present invention, as described below, use of a wire electrode for corona discharge allows charges to be deposited on respective dielectric films of a plurality of microphones at the same time. This increases the productivity of microphones.

Embodiment 1

An electretization method and apparatus according to the first embodiment of the present invention will be described hereinafter with reference to the drawings.

Figure 1:
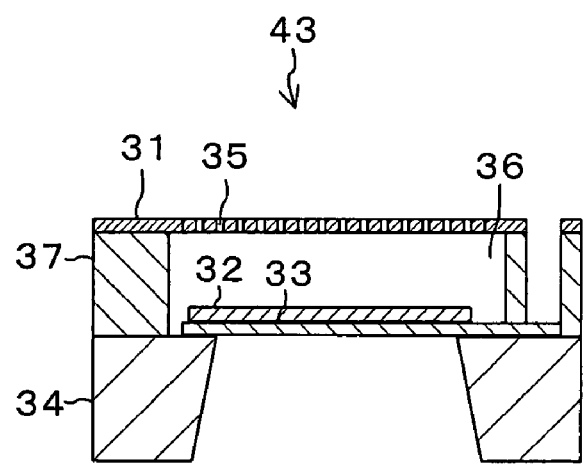
FIG. 1 is a cross-sectional view for explaining the structure of a silicon microphone fabricated by micromachining a silicon substrate.

FIG. 1 is a cross-sectional view for explaining the structure of the silicon microphone fabricated by micromachining a silicon substrate.

As illustrated in FIG. 1, a silicon microphone 43 includes a silicon substrate (silicon diaphragm) 34, a vibrating film 33 formed to cover a removed region of the silicon substrate 34 and functioning as one of electrodes of a condenser, an inorganic dielectric film 32 that is formed on the vibrating film 33 and will become a film to be electretized, and a fixed electrode 31 supported on the silicon substrate 34 by a spacer 37 so as to be opposed to the vibrating film 33 and functioning as the other one of the electrodes of the condenser. A plurality of acoustic holes 35 (openings for guiding an acoustic wave to the vibrating film 33) are formed in the fixed electrode 31. An air gap 36 formed by etching a sacrificial layer is interposed between the vibrating film 33 and the fixed electrode 31. The vibrating film 33, the fixed electrode 31 and the inorganic dielectric film 32 that form the silicon microphone 43 are fabricated by utilizing a micromachining technique for silicon and a process technique for fabricating CMOS transistors (complementary field effect transistors).

Figure 2:
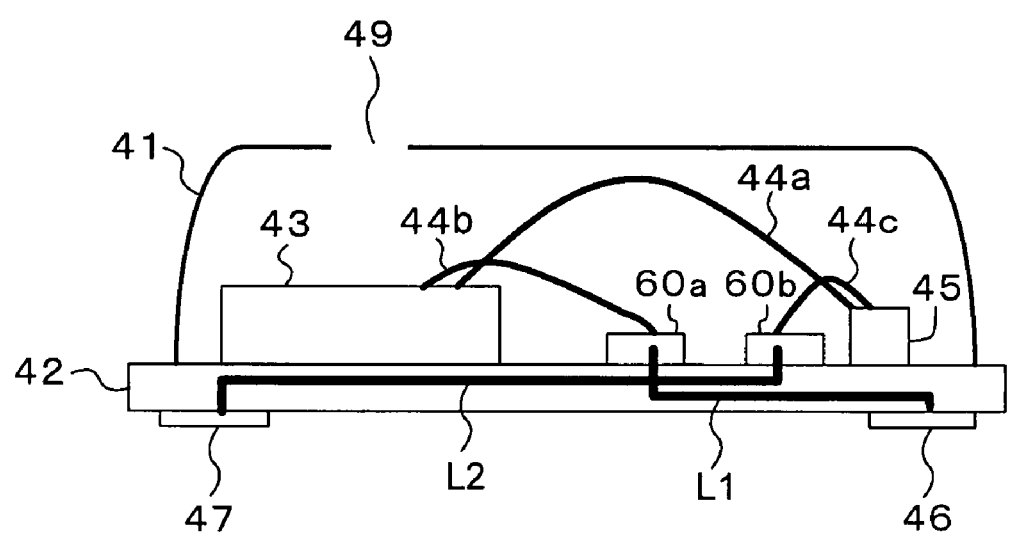
FIG. 2 is a cross-sectional view illustrating a silicon microphone mounted on a substrate enclosed in a case.

FIG. 2 is a cross-sectional view illustrating the structure of a packaged electret microphone in which a silicon substrate is used (the structure of the electret microphone enclosed in a case). In FIG. 2, the same components as those in FIG. 1 are denoted by the same reference numerals, and thus redundant description is omitted. In FIG. 2, a silicon microphone (semiconductor device) 43 is illustrated while being simplified (its actual structure is as illustrated in FIG. 1).

As illustrated in FIG. 2, a silicon microphone (semiconductor device) 43 and an electronic device (a FET, a resistor, an amplifier, or any other element) that is another element are mounted on a substrate 42 for packaging made of plastic or ceramic.

The substrate 42 for packaging is provided at its back surface with a ground pattern 46 and a microphone signal output pattern 47. As illustrated in FIG. 2, when actually used, the silicon microphone 43 is mounted on the substrate 42 for packaging. A vibrating film 33 serving as one of electrodes of a condenser is electrically connected through a bonding wire 44a to another electronic device 45. Another electronic device 45 is electrically connected through a bonding wire 44c to an interconnect pattern 60b on the substrate 42 for packaging. A fixed electrode 31 serving as the other one of the electrodes of the condenser is electrically connected through a bonding wire 44b to an interconnect pattern 60a on the substrate 42 for packaging. The interconnect patterns 60a and 60b are electrically connected through wires L1 and L2 inside the substrate 42 for packaging to the ground pattern 46 and the microphone signal output pattern 47, respectively, which are formed on the back surface of the substrate 42 for packaging.

A shield case 41 is fixed on the substrate 42 for packaging after electretization and provided with a wide opening 49 serving as an acoustic hole for guiding an acoustic wave into the case 41.

Figure 3:
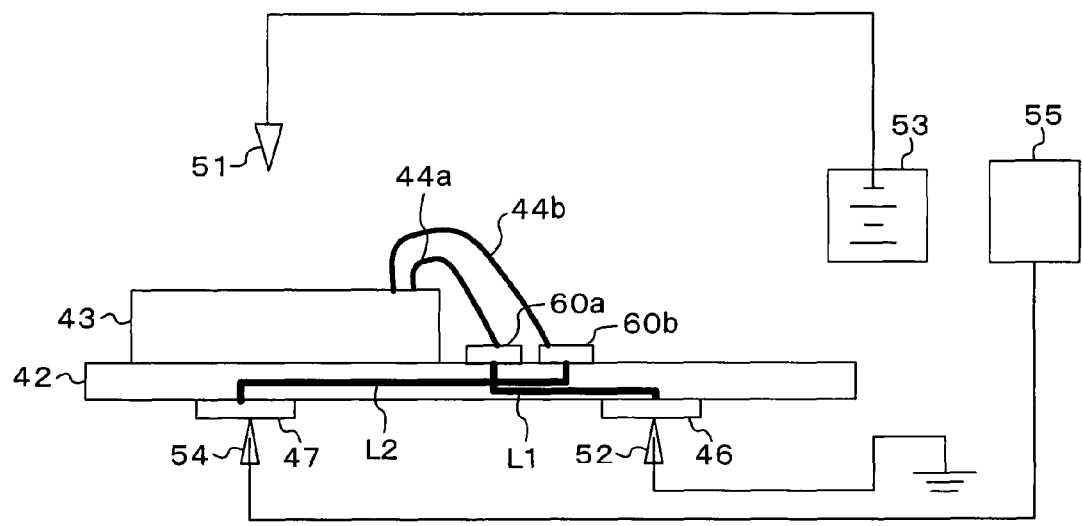
FIG. 3 is a diagram illustrating the structure of a principal part of an electretization apparatus according to a first embodiment of the present invention.

FIG. 3 is a diagram illustrating a principal part of an electretization apparatus of this embodiment. In FIG. 3, the same components as those in FIGS. 1 and 2 are denoted by the same reference numerals, and thus redundant description is omitted.

The electretization apparatus illustrated in FIG. 3 electretizes a dielectric film by applying ions to a single silicon microphone by corona discharge using a single needle electrode.

As illustrated in FIG. 3, corona discharge using a needle electrode 51 is utilized in electretization of this embodiment. More particularly, the needle electrode 51 is positioned above a silicon microphone (semiconductor device) 43. A high voltage power source 53 for causing corona discharge is connected to the needle electrode 51. A high voltage power source 53 applies a high voltage of, for example, approximately 5 through 10 kV to the needle electrode 51.

In the process step of depositing charges on the dielectric film to electretize the dielectric film (hereinafter, referred to as "electretization process step"), the silicon microphone 43 is provided with wires in a different manner from when packaged.

To be specific, also in the electretization process step, as illustrated in FIG. 3, the silicon microphone 43 is mounted on the substrate 42 for packaging. However, unlike the packaging state illustrated in FIG. 2, a vibrating film 33 serving as one of electrodes of a condenser and a fixed electrode 31 serving as the other one thereof are electrically connected through bonding wires 44a and 44b to interconnect patterns 60a and 60b, respectively, on the substrate 42 for packaging. The interconnect patterns 60a and 60b are electrically connected through wires L1 and L2 in the substrate 42 for packaging to the ground pattern 46 and the microphone signal output pattern 47, respectively, formed on the back surface of the substrate 42 for packaging.

As illustrated in FIG. 3, a ground pin (electretization apparatus pin) 52 is connected to the ground pattern 46 formed on the back surface of the substrate 42 for packaging. The vibrating film 33 of the silicon microphone 43 is electrically connected through the wire 44a, the interconnect pattern 60a located on the substrate 42 for packaging, and the wire L1 in the substrate 42 for packaging to the ground pattern 46 formed on the back surface of the substrate 42 for packaging. In view of the above, connection between the ground pin (electretization apparatus pin) 52 and the ground pattern 46 allows the vibrating film 33 and a dielectric film 32 to have a ground potential.

On the other hand, as illustrated in FIG. 3, a voltage application pin (electretization apparatus pin) 54 is connected to the microphone signal output pattern 47 formed on the back surface of the substrate 42 for packaging, and the voltage application pin (electretization apparatus pin) 54 is connected to a unit 55 for supplying various voltages (hereinafter, referred to as "variable voltage supplier 55"). As described above, the fixed electrode 31 of the silicon microphone 43 is electrically connected through the wire 44b, the interconnect pattern 60b located on the substrate 42 for packaging and the wire L2 in the substrate 42 for packaging to the microphone signal output pattern 47 formed on the back surface of the substrate 42 for packaging. In view of the above, connection between the voltage application pin (electretization apparatus pin) 54 and the microphone signal output pattern 47 allows the fixed electrode 31 to have a potential set by the variable voltage supplier 55, i.e., a different potential from the ground potential.

In the above-mentioned state illustrated in FIG. 3, ions produced by corona discharge using the needle electrode 51 are applied to an inorganic dielectric film 32 in the silicon microphone 43 (see FIG. 1). In this way, the inorganic dielectric film 32 of the silicon microphone 43 (see FIG. 1) can be electretized by a voltage applied to the fixed electrode 31.

In a known method, a fixed electrode is grounded or electrically floating. Since in this case ions pass through the fixed electrode and flow into the ground, this prevents an appropriate amount of ions from being applied to a dielectric film. In particular, with a reduction in the size of each of acoustic holes formed in the fixed electrode, the amount of ions applied to the dielectric film is reduced. Therefore, the dielectric film becomes less likely to be electretized.

On the other hand, in this embodiment, as illustrated in FIGS. 1 and 3, the fixed electrode 31 of the silicon microphone 43 is allowed to have a different potential from the ground potential, thereby producing a difference in potential between the vibrating film 33 and the fixed electrode 31. As a result, ions produced by corona discharge using the needle electrode 51 are attracted to the dielectric film 32 via the plurality of acoustic holes 35 formed in the fixed electrode 31.

Then, the dielectric film 32 is gradually electretized so that its potential (electret potential) is gradually increased. Finally, the potential of the top surface of the dielectric film 32 on the vibrating film 33 becomes equal to the potential of the fixed electrode 35.

When the potential of the dielectric film 32 is equal to that of the fixed electrode 35, this prevents ions from being applied to the dielectric film 32 as in the known method. Therefore, the dielectric film 32 is electretized until the electret potential becomes equal to the potential applied to the fixed electrode 35.

As described above, according to this embodiment, in a condenser microphone formed by micromachining a silicon substrate, a dielectric film 32 can be electretized with high accuracy such that even when acoustic holes 35 formed in a fixed electrode 31 are small, an intended amount of charges are deposited on the dielectric film 32 without previously examining the electretization conditions.

Furthermore, according to this embodiment, the amount of electrostatic charges on the dielectric film 32 can be adjusted by the magnitude of the potential of the fixed electrode 31 set by the variable voltage supplier 55.

Embodiment 2

An electretization method and an electretization apparatus according to a second embodiment of the present invention will be described hereinafter with reference to the drawings.

Figure 4:
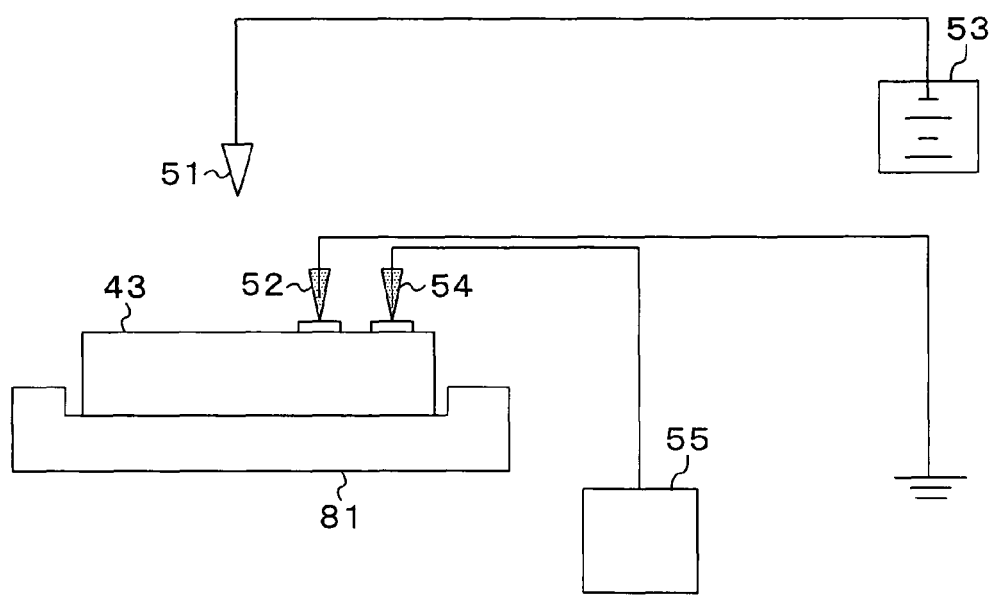
FIG. 4 is a diagram illustrating the structure of a principal part of an electretization apparatus according to a second embodiment of the present invention.

FIG. 4 is a diagram illustrating the structure of a principal part of an electretization apparatus according to this embodiment. In FIG. 4, the same components as those in FIGS. 1 through 3 are denoted by the same reference numerals, and thus redundant description is omitted.

The electretization apparatus illustrated in FIG. 4 electretizes a dielectric film by applying ions to a chip of a single silicon microphone 43 by corona discharge using a single needle electrode.

As illustrated in FIG. 4, in this embodiment, the silicon microphone 43 is placed on a setting fixture 81 for electretization. A vibrating film 33 and fixed electrode 31 of the silicon microphone 43 are electrically connected to a ground pin 52 and a voltage application pin 54, respectively. The ground pin 52 is connected through a lead to the ground. In this way, the vibrating film 33 and the dielectric film 32 can have the ground potential. The voltage application pin 54 is connected through a lead to a variable voltage supplier 55. Thus, the fixed electrode 31 can be set by the variable voltage supplier 55 to have a different potential from the ground potential.

In the above-described state illustrated in FIG. 4, corona discharge is caused by a needle electrode 51 above the fixed electrode 31, and resultant ions are applied to the dielectric film 32 in the silicon microphone 43 (see FIG. 1), thereby electretizing the dielectric film 32.

According to this embodiment, the same effect as in the first embodiment can be attained by the same electretization process as in the first embodiment. Since the dielectric film 32 of the silicon microphone 43 is electretized before the silicon microphone 43 is mounted on a substrate 42 for packaging, the following effects can be provided. More particularly, the above-mentioned electretization eliminates the need for electrically connecting the silicon microphone 43 to the substrate 42 for packaging through a bonding wire or the like. Furthermore, each chip can be examined separately in terms of the sensitivity of the silicon microphone 43 and the amount of electret charges. In other words, the silicon microphone 43 that is not packaged can be examined in terms of the sensitivity of the silicon microphone 43 and the amount of electret charges. This examination allows defective chips to be detected before packaging. This reduces the loss caused by discarding substrates for packaging and packaged devices.

Embodiment 3

An electretization method and an electretization apparatus according to a third embodiment of the present invention will be described hereinafter with reference to the drawings.

Figure 5:
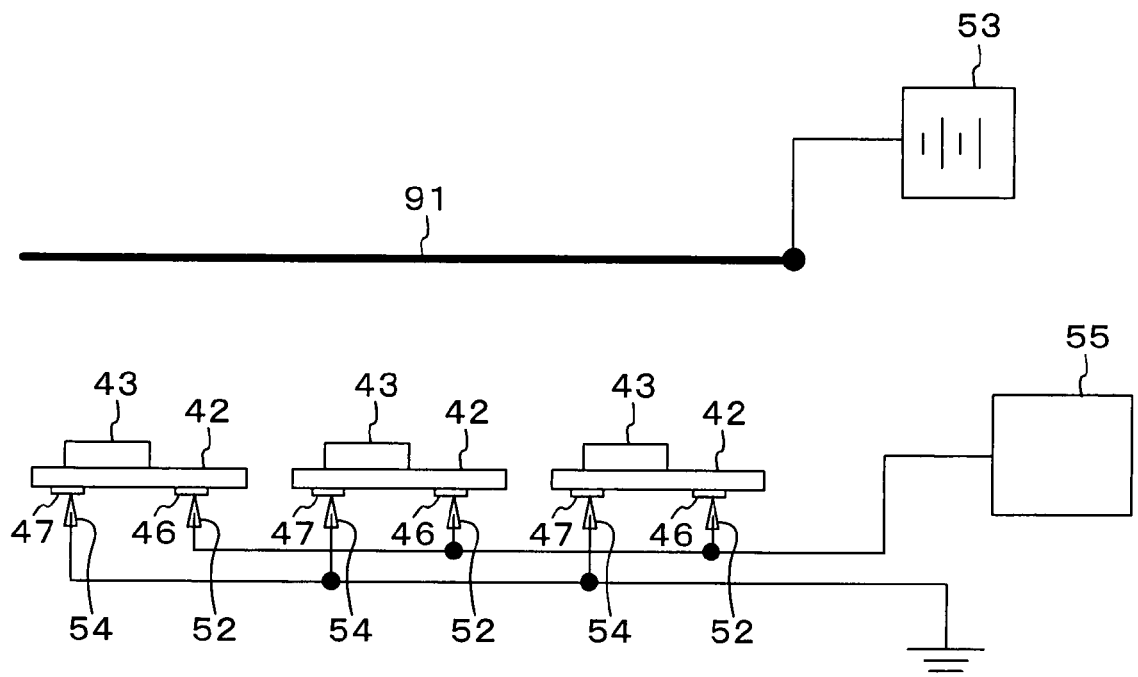
FIG. 5 is a diagram illustrating the structure of a principal part of an electretization apparatus according to a third embodiment of the present invention.
Figure 6:
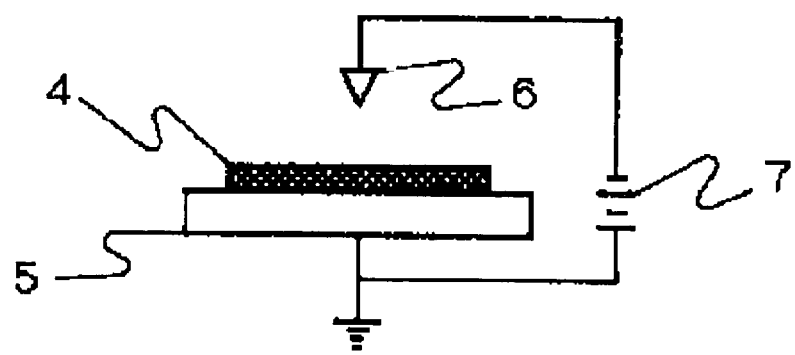
FIG. 6 is a cross-sectional view illustrating a principal part of a known electretization apparatus.
Figure 7:
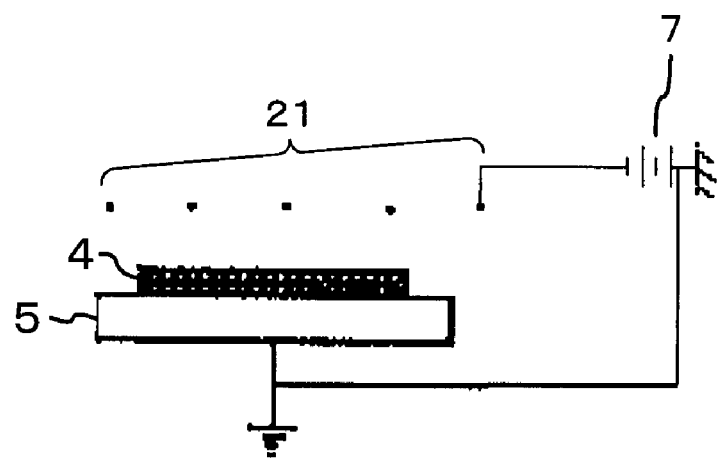
FIG. 7 is a cross-sectional view illustrating a principal part of another known electretization apparatus.

FIG. 5 is a diagram illustrating the structure of a principal part of the electretization apparatus of this embodiment. In FIG. 5, the same components as those in FIGS. 1 through 4 are denoted by the same reference numerals, and thus redundant description is omitted.

The electretization apparatus illustrated in FIG. 5 electretizes a dielectric film by applying ions to chips of a plurality of silicon microphones 43 by corona discharge using a wire electrode 91.

As illustrated in FIG. 5, corona discharge using the wire electrode 91 is utilized for electretization of this embodiment. The wire electrode 91 is positioned above the silicon microphone (semiconductor device) 43. A high voltage power source 53 for causing corona discharge is connected to the wire electrode 91. The high voltage power source 53 applies a high voltage of, for example, 5 through 10 kV to the wire electrode 91.

A plurality of silicon microphones 43 mounted on associated substrates are arranged below the wire electrode 91. Like the first embodiment illustrated in FIG. 3, ground pins 52 and voltage application pins 54 are electrically connected to ground patterns 46 and microphone signal output patterns 47, respectively, formed on the back surface of substrates 42 for packaging provided with the silicon microphones 43. In this way, a fixed electrode 31 of each silicon microphone 43 can be set to have a different potential from a ground potential, and a vibrating film 33 and dielectric film 32 thereof can be set to have the ground potential.

In the above-mentioned state illustrated in FIG. 5, corona discharge is caused by the wire electrode 91, and resultant ions are applied to a dielectric film 32 (see FIG. 1) in each silicon microphone 43, thereby electretizing the dielectric film 32.

According to this embodiment, the same effect as in the first embodiment can be provided by the same electretization process as in the first embodiment. Respective dielectric films 32 (see FIG. 1) of a plurality of silicon microphones 43 can be electretized at the same time by voltages applied to associated fixed electrodes 31. This can enhance the productivity of silicon microphones.

What is claimed is:

1. A method for electretizing a dielectric film of a condenser microphone comprising a fixed electrode having a plurality of acoustic holes, a vibrating film placed so as to be opposed to the fixed electrode, and the dielectric film formed on the vibrating film so as to be located between the fixed electrode and the vibrating film, said method comprising the steps of:
   (a) setting the dielectric film to have a ground potential;
   (b) setting the fixed electrode to have a different potential from the ground potential; and
   (c) allowing ions produced by corona discharge to pass through the plurality of acoustic holes formed in the fixed electrode and reach the dielectric film, thereby electretizing the dielectric film with the dielectric film being set to have the ground potential, and the fixed electrode being set to have the different potential.

2. The method of claim 1, wherein
   the condenser microphone is mounted on a substrate for packaging,
   the step (a) includes the step of setting the dielectric film to have the ground potential through a first electrode formed on the substrate for packaging; and
   the step (b) includes the step of setting the fixed electrode to have the different potential through a second electrode formed on the substrate for packaging.

3. The method of claim 1, wherein
   the step (a) includes the step of setting the dielectric film to have the ground potential through a first probe pin, and
   the step (b) includes the step of setting the fixed electrode to have the different potential through a second probe pin.

4. The method of claim 1, wherein the step (c) includes the step of causing the corona discharge using a wire electrode.

5. The method of claim 1, wherein the step (c) includes the step of causing the corona discharge using a needle electrode.

6. The method of claim 1, wherein the amount of electric charges deposited on the dielectric film in the step (c) is adjusted by the magnitude of the different potential of the fixed electrode in the step (b).

7. A condenser microphone comprising the dielectric film electretized by the method of claim 1.

8. An electretization apparatus for electretizing a dielectric film of a condenser microphone comprising a fixed electrode having a plurality of acoustic holes, a vibrating film placed so as to be opposed to the fixed electrode, and the dielectric film formed on the vibrating film so as to be located between the fixed electrode and the vibrating film, said electretization apparatus comprising:
   an electrode used to cause corona discharge;
   a high voltage power source for applying a high voltage to the electrode;
   a voltage supply for setting the fixed electrode to have a different potential from a ground potential;
   a ground pin for setting the dielectric film to have the ground potential, the dielectric film being a film to be electretized; and
   a voltage application pin for setting the fixed electrode to be electrically connected to the voltage supply.

9. The apparatus of claim 8, wherein the voltage supply adjusts the magnitude of the different potential.

10. The apparatus of claim 8, wherein said corona discharge is performed with the dielectric film being set to the ground potential and the fixed electrode being set to the different potential.

* * * * *